United States Patent
Zhao et al.

(10) Patent No.: US 12,374,587 B2
(45) Date of Patent: Jul. 29, 2025

(54) METHOD OF PROCESSING WORKPIECE

(71) Applicant: DISCO CORPORATION, Tokyo (JP)

(72) Inventors: Jinyan Zhao, Tokyo (JP); Yihui Lee, Tokyo (JP)

(73) Assignee: DISCO CORPORATION, Tokyo (JP)

(*) Notice: Subject to any disclaimer, the term of this patent is extended or adjusted under 35 U.S.C. 154(b) by 635 days.

(21) Appl. No.: 17/815,791

(22) Filed: Jul. 28, 2022

(65) Prior Publication Data

US 2023/0053191 A1 Feb. 16, 2023

(30) Foreign Application Priority Data

Aug. 12, 2021 (JP) .................................. 2021-131829

(51) Int. Cl.
| | |
|---|---|
| *H01L 21/78* | (2006.01) |
| *B23K 26/53* | (2014.01) |
| *H01L 21/268* | (2006.01) |
| *H01L 21/302* | (2006.01) |
| *H01L 21/67* | (2006.01) |

(52) U.S. Cl.
CPC ............. *H01L 21/78* (2013.01); *B23K 26/53* (2015.10); *H01L 21/268* (2013.01); *H01L 21/302* (2013.01); *H01L 21/67288* (2013.01)

(58) Field of Classification Search
None
See application file for complete search history.

(56) References Cited

U.S. PATENT DOCUMENTS

2008/0007737 A1* 1/2008 Sekiya .............. H01L 21/67092
356/614
2024/0207978 A1* 6/2024 Ogiwara ........... H01L 21/67092

FOREIGN PATENT DOCUMENTS

JP    2017084923 A  *  5/2017
JP    2020136457 A     8/2020

OTHER PUBLICATIONS

JP 2017084923 A Machine translation (Year: 2017).*

* cited by examiner

*Primary Examiner* — Erik T. K. Peterson
(74) *Attorney, Agent, or Firm* — Greer Burns & Crain Ltd.

(57) ABSTRACT

A method of processing a warped workpiece includes a warpage eliminating step of applying a laser beam whose wavelength is transmittable through the workpiece to the workpiece while positioning a focused spot of the laser beam in the workpiece at a predetermined first position thicknesswise across the workpiece, thereby forming modified layers in the workpiece and cracks extending from the modified layers to a lower surface of the workpiece along all of projected dicing lines on the workpiece, thereby eliminating the warpage from the workpiece, and a modified layer forming step of, after the warpage eliminating step, applying the laser beam to the workpiece while positioning the focused spot of the laser beam in the workpiece at a position above the first position away from the lower surface of the workpiece, thereby forming modified layers in the workpiece along the projected dicing lines.

4 Claims, 11 Drawing Sheets

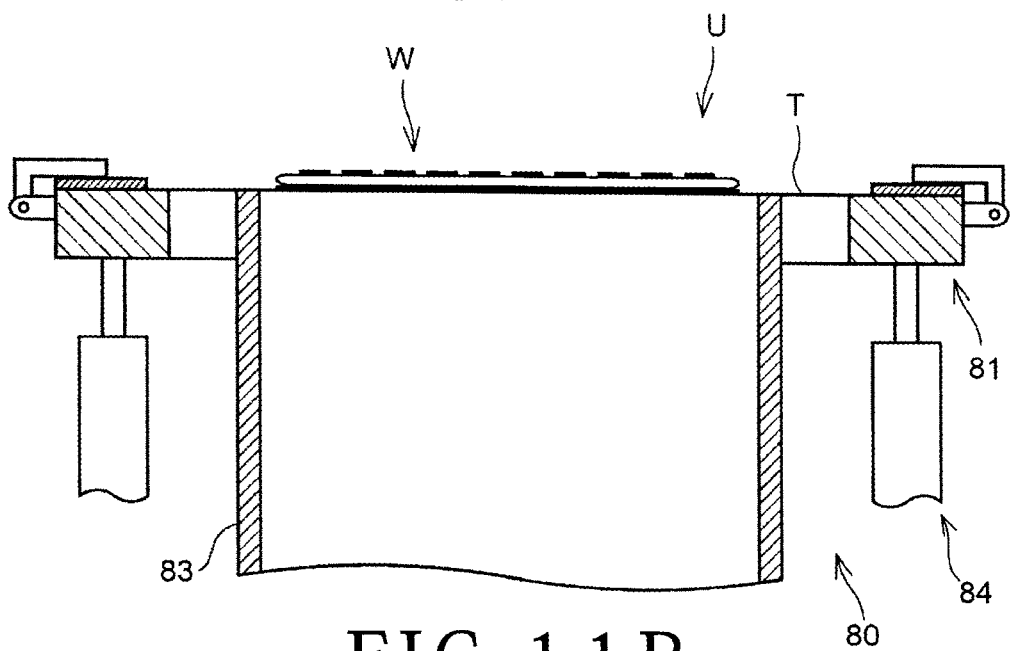
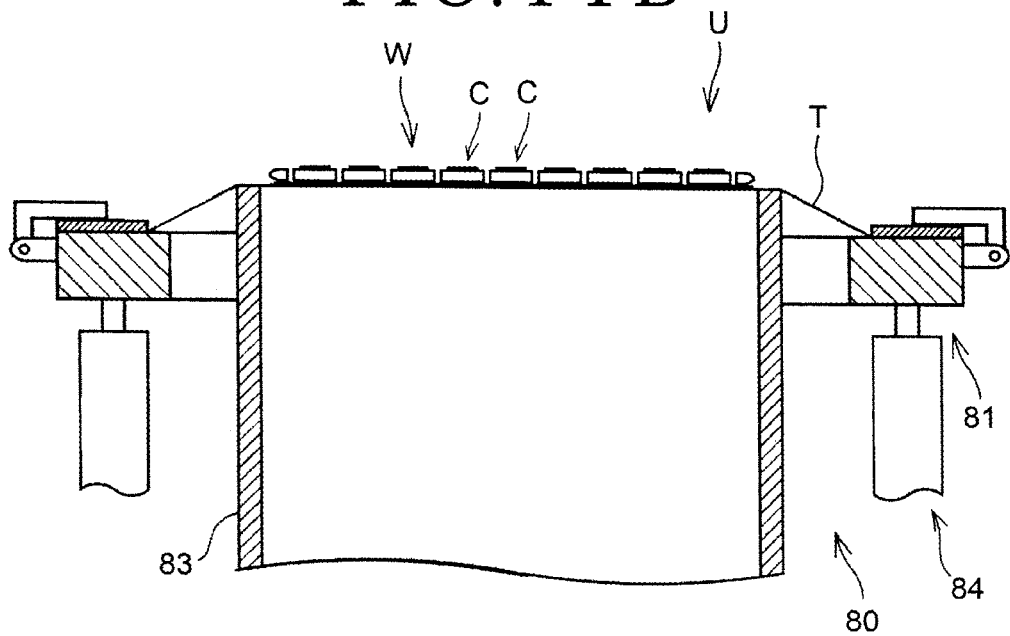

METHOD OF PROCESSING WORKPIECE

BACKGROUND OF THE INVENTION

Field of the Invention

The present invention relates to a method of processing a warped workpiece with a plurality of intersecting projected dicing lines established thereon.

Description of the Related Art

Heretofore, it has been known in the art to form a plurality of modified layers in a wafer at positions that are different thicknesswise across the wafer along each of projected dicing lines established thereon, as disclosed in JP2020-136457A, for example.

One problem with forming modified layers in a wafer at positions that are different thicknesswise across the wafer is as follows. A laser beam having a wavelength transmittable through a wafer is emitted from a beam condenser and applied to the wafer while the laser beam is being focused in the wafer at a position closer to the beam condenser, forming modified layers in the wafer at the closer position. Thereafter, when the laser beam is to be focused in the wafer at a position remoter from the beam condenser, the previously formed modified layers tend to prevent the laser beam from being focused at the remoter position, making it difficult to form modified layers in the wafer at the remoter position.

As disclosed in JP2020-136457A, it has been general practice to form modified layers in a wafer at thicknesswise different positions successively in the order from remoter to closer positions. After a plurality of modified layers have been formed in the wafer at thicknesswise different positions along one projected dicing line, a plurality of modified layers are similarly formed in the wafer at thicknesswise different positions along an adjacent projected dicing line. The process is repeated until a plurality of modified layers are formed in the wafer along all projected dicing lines thereon.

SUMMARY OF THE INVENTION

In a case where a wafer is warped, internal stresses due to the warpage are present in the wafer. While a plurality of modified layers are being formed in the wafer at thicknesswise different positions along one projected dicing line, the internal stresses may be released, possibly developing a crack in the wafer. If the crack reaches devices on the wafer, the devices tend to be damaged.

In addition, when the internal stresses are released, projected dicing lines on the wafer may be curved or bent. Device chips produced by dividing the wafer along curved or bent projected dicing lines tend to have chip sizes deviating from a designed size, and hence become defective if their chip sizes fall out of an allowable range.

It is therefore an object of the present invention to provide a method of processing a workpiece to eliminate warpage therefrom and to form a plurality of modified layers in the workpiece at thicknesswise different positions therein.

In accordance with an aspect of the present invention, there is provided a method of processing a warped workpiece with a plurality of intersecting projected dicing lines established thereon, including a placing step of placing the workpiece in an upwardly convex orientation on a holding surface of a holding table that is capable of holding the workpiece under suction thereon, a warpage eliminating step of, after the placing step, holding the workpiece under suction on the holding surface of the holding table and applying a laser beam whose wavelength is transmittable through the workpiece to the workpiece while positioning a focused spot of the laser beam in the workpiece at a predetermined first position thicknesswise across the workpiece, thereby forming modified layers in the workpiece and cracks extending from the modified layers to a lower surface of the workpiece along all of the projected dicing lines, thereby eliminating the warpage from the workpiece, and a modified layer forming step of, after the warpage eliminating step, applying the laser beam to the workpiece while positioning the focused spot of the laser beam in the workpiece at a position above the first position away from the lower surface of the workpiece, thereby forming modified layers in the workpiece along the projected dicing lines, in which the warpage eliminating step includes the steps of detecting the vertical position of an upper surface of the workpiece each time the laser beam is to be applied to the workpiece along each of the projected dicing lines, and positioning the focused spot of the laser beam in the workpiece on the basis of the detected vertical position of the upper surface of the workpiece.

Preferably, the method of processing a warped workpiece further includes a dividing step of, after the modified layer forming step, dividing the workpiece along the projected dicing lines by exerting external forces to the workpiece.

Preferably, the modified layer forming step includes the steps of applying the laser beam to the workpiece along each of the projected dicing lines while positioning the focused spot of the laser beam in the workpiece at a second position above the first position, thereby forming a second modified layer in the workpiece, and thereafter applying the laser beam to the workpiece along the projected dicing line while positioning the focused spot of the processing laser beam in the workpiece at a third position above the second position, thereby forming a third modified layer in the workpiece.

Preferably, the workpiece is warped such that the upper surface thereof is of a convex shape, the placing step includes the step of placing the workpiece on the holding table while the lower surface of the workpiece is facing downwardly toward the holding surface of the holding table, a holding step includes the step of holding the lower surface of the workpiece on the holding table, and each of the warpage eliminating step and the modified layer forming step includes the step of applying the laser beam to the workpiece from the upper surface thereof.

According to the present invention, the focused spot of the laser beam can be positioned at a predetermined position thicknesswise across the workpiece, causing the cracks to reliably reach the lower surface of the workpiece for eliminating the warpage from the workpiece. The vertical position of the upper surface of the workpiece may vary due to the elimination of the warpage from the workpiece on account of the modified layers formed in the workpiece. However, as the vertical position of the upper surface of the workpiece is detected immediately before the workpiece is processed, the focused spot of the laser beam can be positioned at a predetermined position thicknesswise across the workpiece.

In the modified layer forming step described above, inasmuch as the warpage has been eliminated from the workpiece in the warpage eliminating step, unexpected cracks are prevented from being developed in the workpiece and projected dicing lines on the wafer are prevented from being curved or bent during the modified layer forming step.

Accordingly, devices on the workpiece are prevented from being damaged, and device chips produced from the workpiece are prevented from becoming defective.

The above and other objects, features and advantages of the present invention and the manner of realizing them will become more apparent, and the invention itself will best be understood from a study of the following description and appended claims with reference to the attached drawings showing some preferred embodiment of the invention.

BRIEF DESCRIPTION OF THE DRAWINGS

FIG. 11A is a cross-sectional view illustrating a dividing step by way of example; and FIG. 11B is a cross-sectional view illustrating the workpiece that has been divided into device chips.

DETAILED DESCRIPTION OF THE PREFERRED EMBODIMENT

Figure 1A:
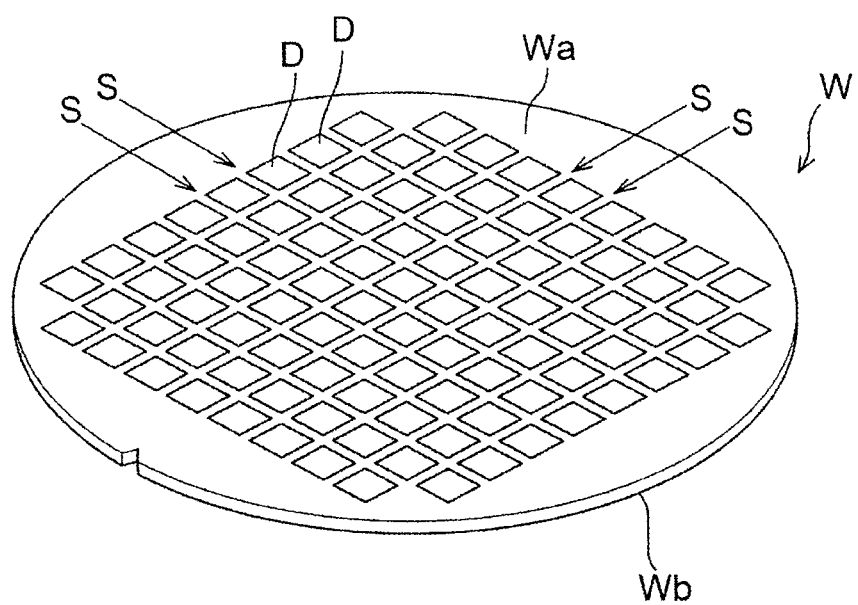
FIG. 1A is a perspective view illustrating a workpiece by way of example.

A preferred embodiment of the present invention will be described in detail below with reference to the drawings. FIG. 1 illustrates, in perspective, a warped workpiece W by way of example. As illustrated in FIG. 1, the workpiece W that is of a circular shape includes a wafer made of a material such as silicon (Si), silicon carbide (SiC), gallium nitride (GaN), gallium arsenide (GaAs), or other semiconductors. Alternatively, the workpiece W includes a wafer made of a complex oxide such as lithium tantalate (LT) or lithium niobate (LN). Further alternatively, the workpiece W includes a substrate made of a material such as sapphire, glass or quartz. The glass may be alkali glass, non-alkali glass, soda-lime glass, lead glass, borosilicate glass, quartz glass, or the like.

The workpiece W has a face side Wa on which there are formed devices D in a regular pattern that are separated from each other intersecting projected dicing lines or streets S extending between the devices D.

Figure 1B:
FIG. 1B is a side elevational view illustrating the manner in which the workpiece is warped.

As illustrated in FIG. 1B, the workpiece W is warped such that the face side Wa is shrunk into a concave shape and a reverse side Wb opposite the face side Wa is expanded into a convex shape. Alternatively, the workpiece W may be warped such that the face side Wa is expanded into a convex shape.

Figure 2:
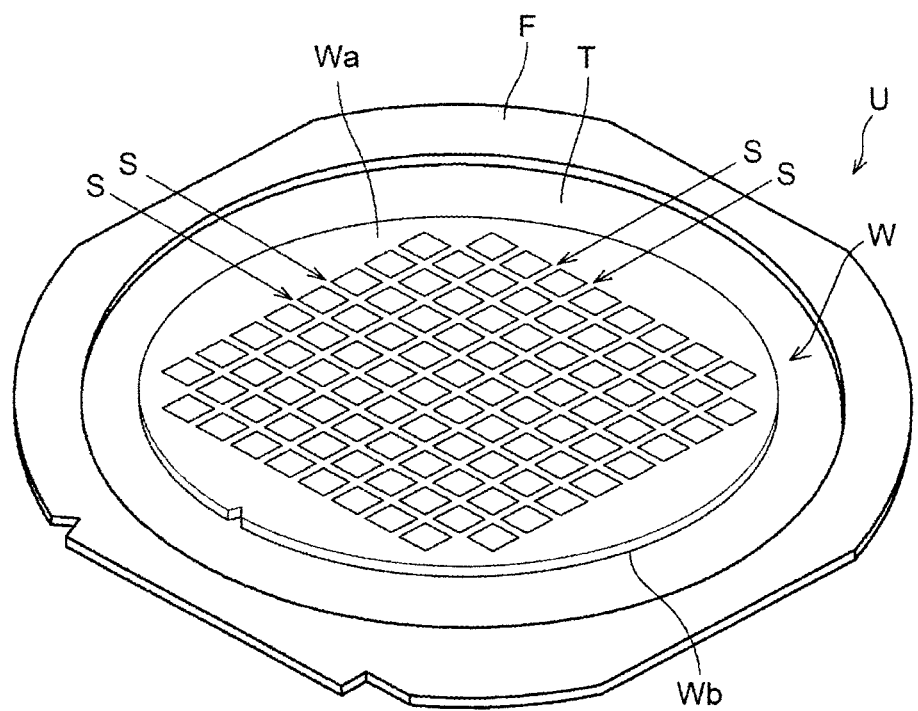
FIG. 2 is a perspective view illustrating a frame unit.

As illustrated in FIG. 2, the workpiece W has its reverse side Wb affixed to a circular expandable tape T and is fixed to an annular frame F by the expandable tape T. The workpiece W, the expandable tape T, and the annular frame F are handled as a frame unit U. The face side Wa of the workpiece W in the frame unit U is exposed upwardly. The expandable tape T has an adhesive surface, i.e., a lower surface in FIG. 2, to which the workpiece W and the annular frame F are affixed. The expandable tape T is expandable radially outwardly.

A protective tape, not illustrated, may be affixed to the exposed face side Wa of the workpiece W. In a case where the workpiece W is warped such that the reverse side Wb is shrunk into a concave shape and the face side Wa is expanded into a convex shape, the face side Wa is affixed to the expandable tape T. In addition to being combined with the angular frame F and handled as the frame unit U, the workpiece W may be handled on its own. The expandable tape T may not have an adhesive surface.

Figure 3:
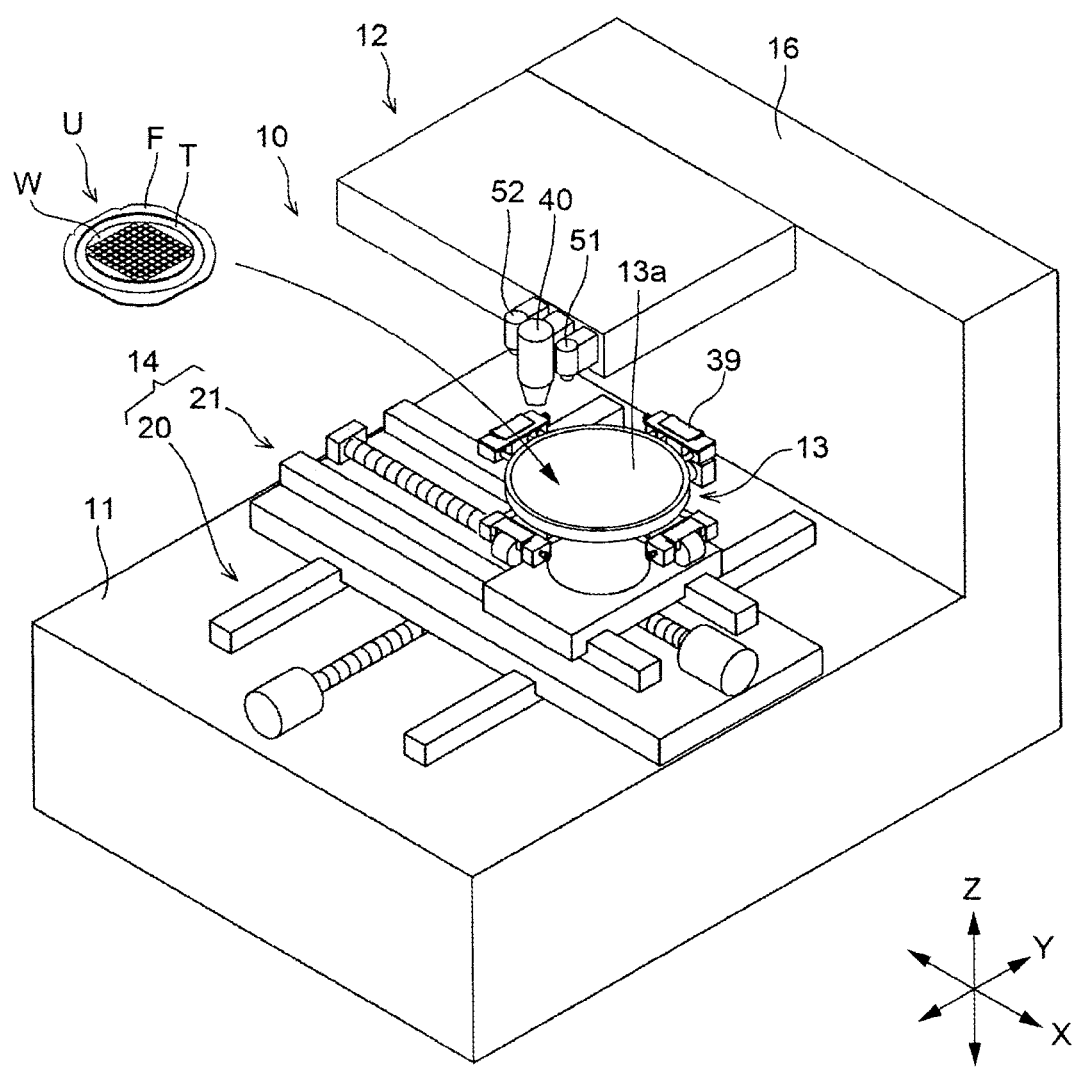
FIG. 3 is a perspective view illustrating a laser processing apparatus by way of example.

FIG. 3 illustrates, in perspective, a laser processing apparatus for processing the workpiece W by way of example. The laser processing apparatus, denoted by 10, includes a laser beam applying mechanism 12 for applying a laser beam to the workpiece W and a holding table 13 having an upper surface for holding the workpiece W thereon. The laser processing apparatus 10 processes the workpiece W while moving the laser beam applying mechanism 12 and the holding table 13 relatively to each other.

The laser processing apparatus 10 has a base 11 in the form of a rectangular parallelepiped. The base 11 supports, on its upper surface, a moving mechanism 14 for processing-feeding the holding table 13 in X-axis directions and indexing-feeding the holding table 13 in Y-axis directions perpendicular to the X-axis directions. An upstanding wall 16 is erected from the base 11 behind the moving mechanism 14. The laser beam applying mechanism 12 is supported on a front surface of the upstanding wall 16 in overhanging relation to the holding table 13.

The moving mechanism 14 includes an indexing feed mechanism 20 for moving the holding table 13 relatively to the laser beam applying mechanism 12 in indexing feed directions, i.e., the Y-axis directions, and a processing feed mechanism 21 for moving the holding table 13 relatively to the laser beam applying mechanism 12 in processing feed directions, i.e., the X-axis directions.

After the workpiece W on the holding table 13 has been processed by a laser beam applied thereto along one of the projected dicing lines S by the laser beam applying mechanism 12, the indexing feed mechanism 20 moves or indexing-feeds the holding table 13 in one of the indexing feed directions for processing the workpiece W with the laser beam along a next parallel projected dicing line S.

After one of the projected dicing lines S on the workpiece W, which is detected by an image capturing camera, not illustrated, has been aligned with a processing head 40 of the laser beam applying mechanism 12, the processing feed mechanism 21 moves or processing-feeds the holding table 13 in one of the processing feed directions for processing the workpiece W with the laser beam along the projected dicing line S.

The holding table 13 is rotatable about a vertical axis (θ-direction rotation) along Z-axis directions perpendicular to the X-axis directions and the Y-axis directions. Four clamps 39 are provided in equally angularly spaced positions around the holding table 13 for clamping, in position, the annular frame F of the frame unit U on the holding table 13.

Figure 4:
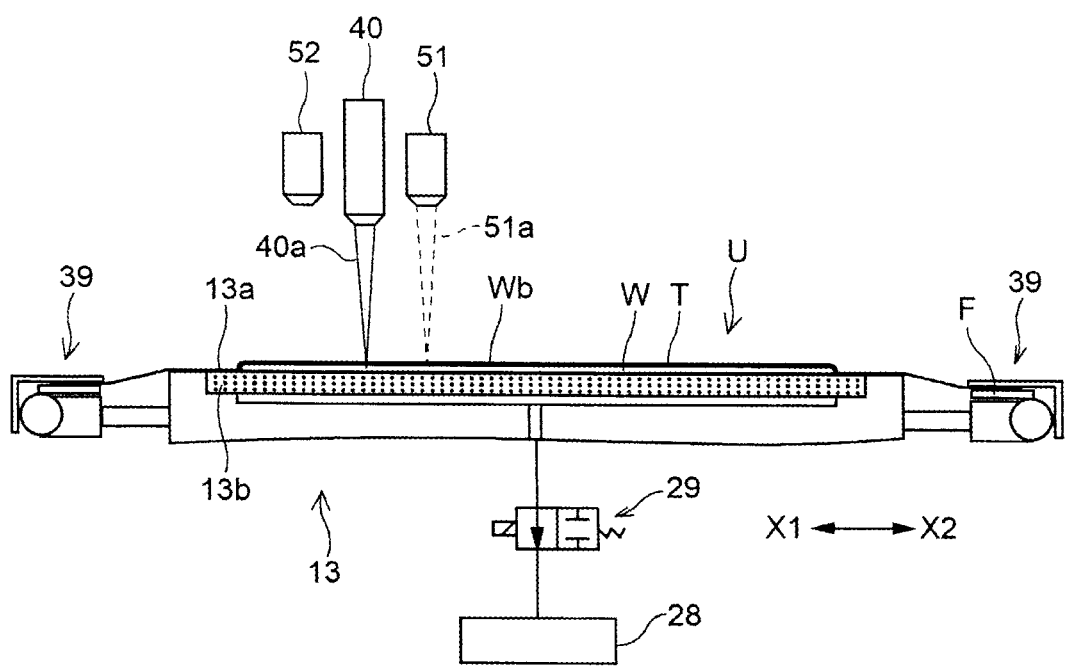
FIG. 4 is a cross-sectional view illustrating the layout of a laser processing head and a measuring head.

As illustrated in FIG. 4, a holding plate 13b made of a porous ceramic material is mounted on an upper side of the holding table 13, and has a horizontal holding surface 13a as the upper surface of the holding plate 13b for holding the workpiece W thereon. The holding plate 13b is held in fluid communication with a suction source 28 through a valve 29. When the suction source 28 is actuated, it generates and applies a negative pressure to the holding surface 13a, holding the workpiece W under suction on the holding surface 13a.

As illustrated in FIG. 3, the laser beam applying mechanism 12 has a laser oscillator for generating a processing laser beam, a condensing lens for converging the laser beam emitted from the laser oscillator onto the workpiece W held on the holding table 13, and a mirror for guiding the laser beam emitted from the laser oscillator to the condensing lens. As illustrated in FIG. 4, the processing head 40 of the laser beam applying mechanism 12 applies the processing laser beam, denoted by 40a, to the workpiece W on the holding table 13.

The processing laser beam 40a has its focused spot set successively to predetermined positions thicknesswise across the workpiece W that are appropriately corrected, as described in detail later.

Figure 5A:
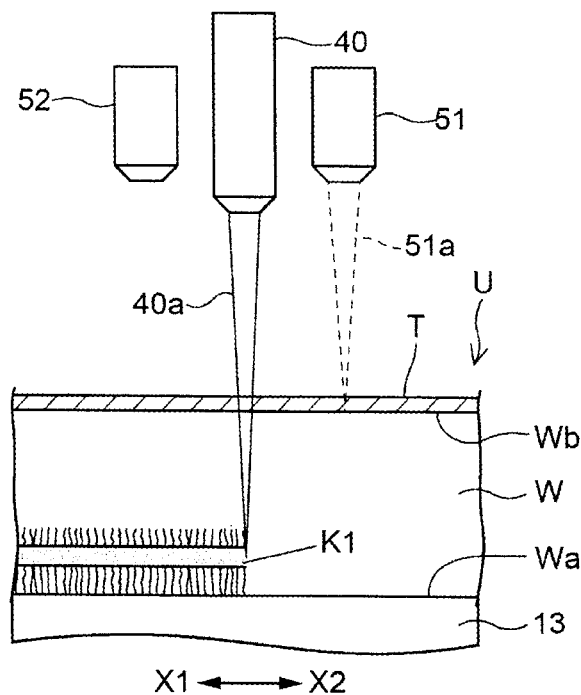
FIG. 5A is an enlarged fragmentary cross-sectional view illustrating the manner in which a laser beam is applied to the workpiece when the workpiece is moved in a first direction.
Figure 5B:
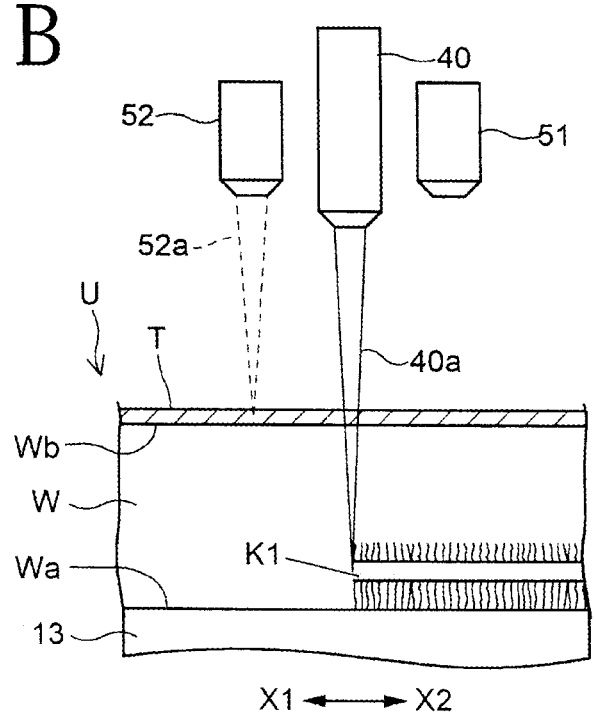
FIG. 5B is an enlarged fragmentary cross-sectional view illustrating the manner in which a laser beam is applied to the workpiece when the workpiece is moved in a second direction.

As illustrated in FIG. 3, the laser beam applying mechanism 12 also has a laser oscillator for generating laser beams for measuring the vertical position of the upper surface, i.e., the reverse side Wb, of the workpiece W, a condensing lens for converging the laser beams emitted from the laser oscillator onto the workpiece W held on the holding table 13, and a mirror for guiding the laser beams emitted from the laser oscillator to the condensing lens. As illustrated in FIGS. 4, 5A, and 5B, the laser beam applying mechanism 12 includes two measuring heads 51 and 52 that apply respective measuring laser beams 51a and 52a to the workpiece W.

As illustrated in FIG. 4, the measuring head 51 continuously applies the measuring laser beam 51a to the workpiece W. The vertical position of the upper surface of the workpiece W as measured by the measuring laser beam 51a is fed back to a controller, not illustrated, of the laser processing apparatus 10 at 0.5 m intervals in the longitudinal direction of the projected dicing line S. On the basis of the vertical position of the upper surface of the workpiece W thus fed back, the controller corrects the focused spot of the processing laser beam 40a to position the focused spot of the processing laser beam 40a in the workpiece W accurately at a predetermined distance from the upper surface, i.e., the reverse side Wb, of the workpiece W or accurately at a predetermined distance from the lower surface, i.e., the face side Wa, of the workpiece W, as illustrated in FIG. 5A.

As illustrated in FIG. 4, the measuring heads 51 and 52 are disposed respectively on both sides of the processing head 40 in the processing feed directions, i.e., the X-axis directions. As illustrated in FIG. 5A, when the holding table 13 moves in a forward stroke along one of the X-axis directions, i.e., along a first direction X1, the vertical position of the upper surface, i.e., the reverse side Wb, of the workpiece W that immediately precedes the processing head 40 in the first direction X1 is detected from the measuring laser beam 51a emitted from the measuring head 51. Furthermore, as illustrated in FIG. 5B, when the holding table 13 moves in a rearward stroke along the other of the X-axis directions, i.e., along a second direction X2, the vertical position of the upper surface, i.e., the reverse side Wb, of the workpiece W that immediately precedes the processing head 40 in the second direction X2 is detected from the measuring laser beam 52a emitted from the measuring head 52.

With the measuring heads 51 and 52 being thus disposed respectively on both sides of the processing head 40, it is possible to process the workpiece W along a certain projected dicing line S in each of forward and rearward strokes of movement of the holding table 13.

Figure 6A:
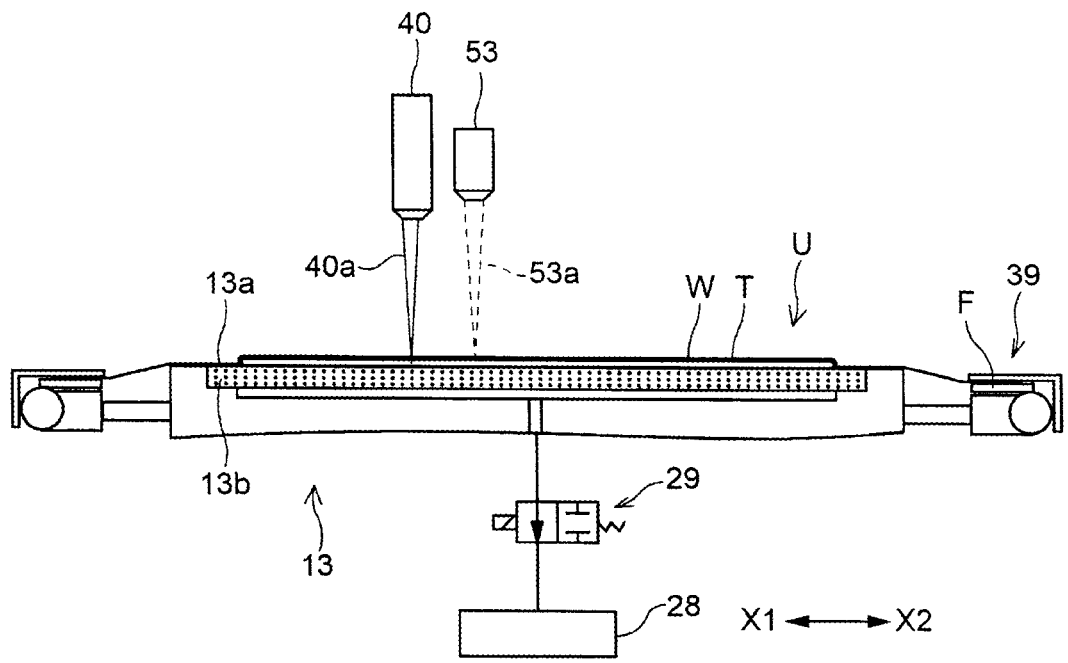
FIG. 6A is a cross-sectional view illustrating an example in which a single measuring head is provided.

Alternatively, as illustrated in FIG. 6A, only one measuring head 53 may be disposed next to the processing head 60, so that the workpiece W may be processed while the holding table 13 is moving in a forward stroke along the first direction X1, the vertical position of the upper surface, i.e., the reverse side Wb, of the workpiece W.

Figure 6B:
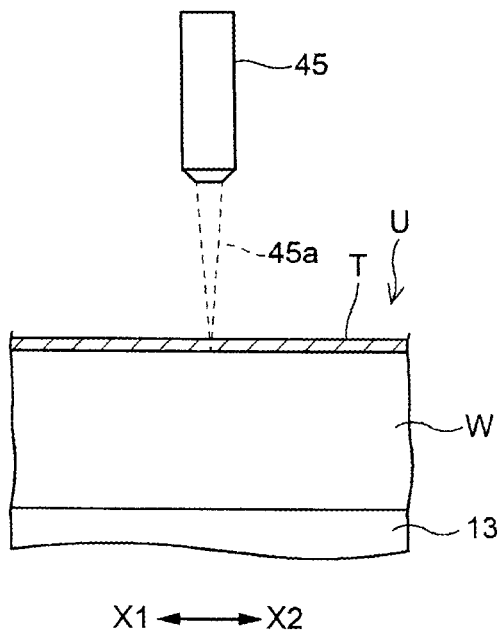
FIG. 6B is an enlarged fragmentary cross-sectional view of an arrangement including a laser beam applying head capable of selectively applying a measuring laser beam and a processing laser beam, illustrating the manner in which the measuring laser beam is applied to the workpiece.
Figure 6C:
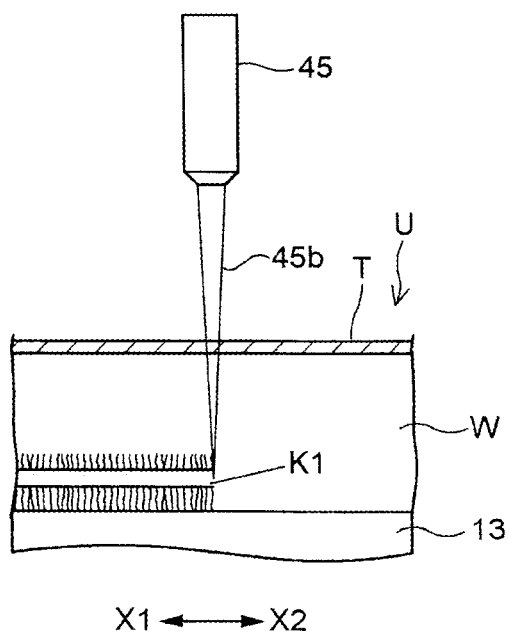
FIG. 6C is an enlarged fragmentary cross-sectional view of the arrangement including the laser beam applying head capable of selectively applying the measuring laser beam and the processing laser beam, illustrating the manner in which the processing laser beam is applied to the workpiece.

Further alternatively, as illustrated in FIGS. 6B and 6C, the laser beam applying mechanism may include a laser beam applying head 45 capable of selectively applying a measuring laser beam 45a and a processing laser beam 45b. As illustrated in FIG. 6B, after the laser beam applying head 45 has applied the measuring laser beam 45a to the workpiece W along a certain projected dicing line S while the holding table 13 is moving in a forward stroke along the first direction X1, the holding table 13 moves back to its original position in a rearward stroke along the second direction X2, and then, as illustrated in FIG. 6C, the laser beam applying head 45 applies the processing laser beam 45b to the workpiece W while the holding table 13 is moving again in a forward stroke along the first direction X1.

Figure 7:
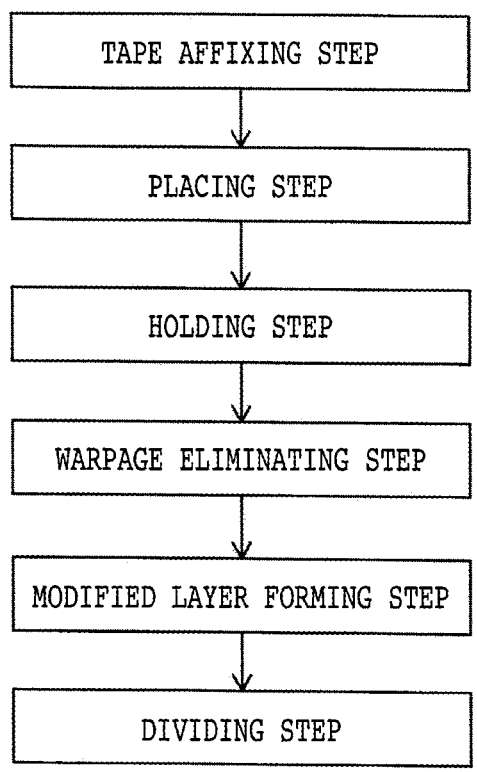
FIG. 7 is a flowchart of a sequence of steps of a method of processing a workpiece according to an embodiment of the present invention.

A method of processing a workpiece on the laser processing apparatus 10 will be described in detail below. FIG. 7 is a flowchart of a sequence of steps of the method of processing a workpiece according to an embodiment of the present invention. The steps of the method include a tape affixing step, a placing step, a holding step, a warpage eliminating step, a modified layer forming step, and a dividing step.

<Tape Affixing Step>

The tape affixing step is a step of affixing the reverse side Wb of the workpiece W to the expandable tape T, as illustrated in FIG. 2. The workpiece W whose reverse side Wb has been affixed to the expandable tape T is integrally combined with the annular frame F by the expandable tape T, making up the frame unit U. Alternatively, the face side Wa of the workpiece W may be affixed to the expandable tape T. In a case where the workpiece W is directly placed on the holding table 13, the tape affixing step is omitted.

<Placing Step>

Figure 8:
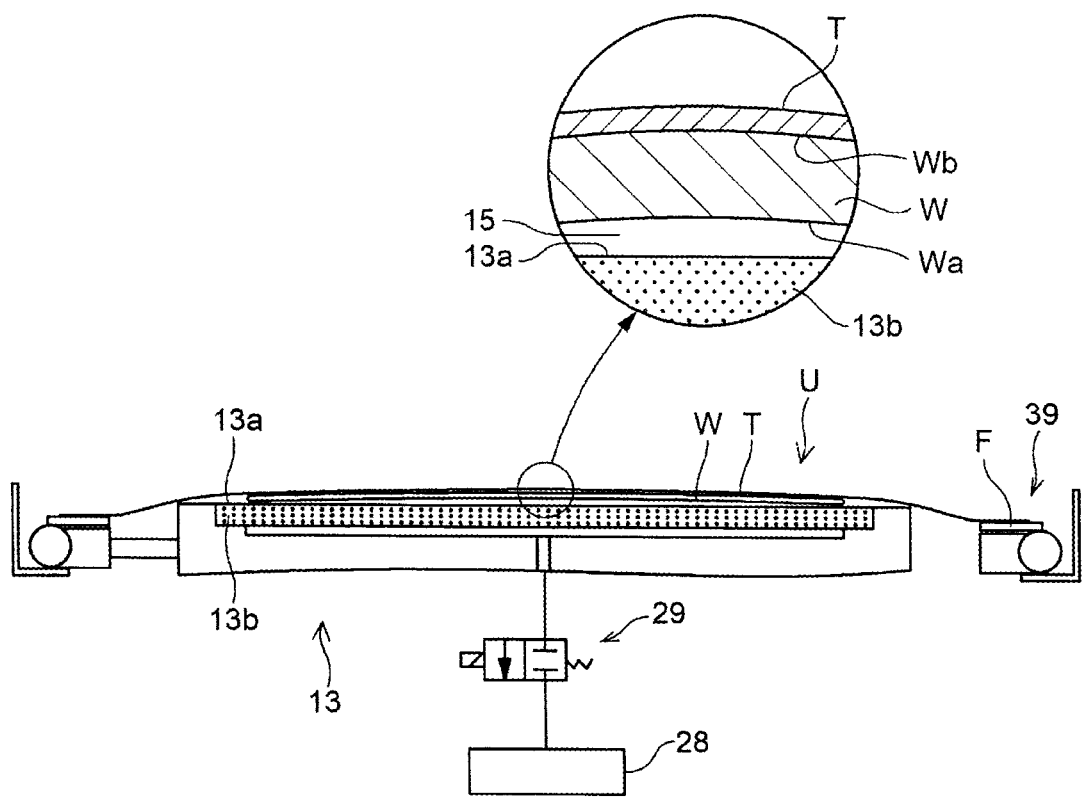
FIG. 8 is a cross-sectional view illustrating a placing step by way of example.

As illustrated in FIG. 8, the placing step is a step of placing the workpiece W in an upwardly convex orientation on the holding surface 13a of the holding table 13.

In the example illustrated in FIG. 8, the workpiece W is warped such that the reverse side Wb thereof is of an upwardly convex shape and the face side Wa thereof is of a downwardly concave shape, facing the holding surface 13*a* of the holding table 13. As described in detail later, a laser beam will be applied to the wafer W from the reverse side Wb thereof. As illustrated in FIG. 8, a gap 15 is present between the face side Wa of the workpiece W and the holding surface 13*a*, and the annular frame F is placed on the clamps 39. In a case where the workpiece W is warped such that the face side Wa thereof is convex upwardly, the reverse side Wb of the workpiece W is placed on the holding surface 13*a*.

<Holding Step>

Figure 9:
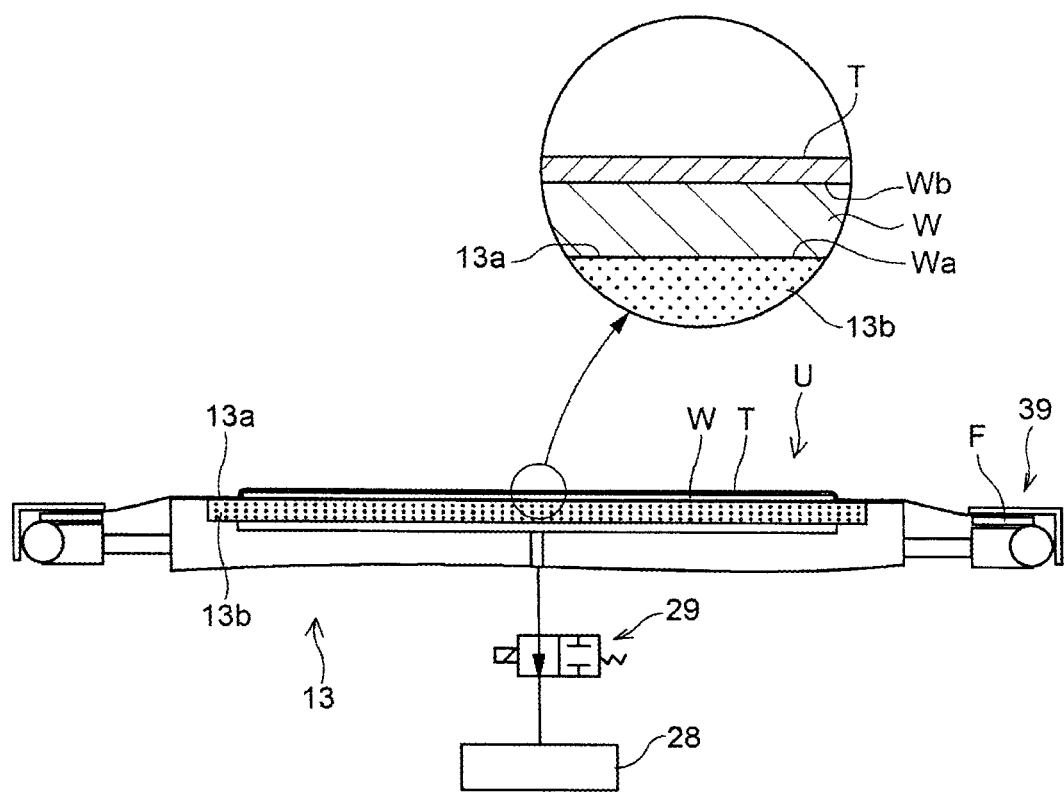
FIG. 9 is a cross-sectional view illustrating a holding step by way of example.

As illustrated in FIG. 9, the holding step is a step of holding the workpiece W under suction on the holding table 13 after the placing step. Specifically, the valve 29 is opened to connect the holding table 13 fluidly to the suction source 28, and the suction source 28 is actuated to apply a negative pressure to the holding surface 13*a*, attracting the face side Wa of the workpiece W to the holding surface 13*a* and holding the workpiece W under suction on the holding surface 13*a*. In addition, the clamps 39 grip the annular frame F.

<Warpage Eliminating Step>

Figure 10A:
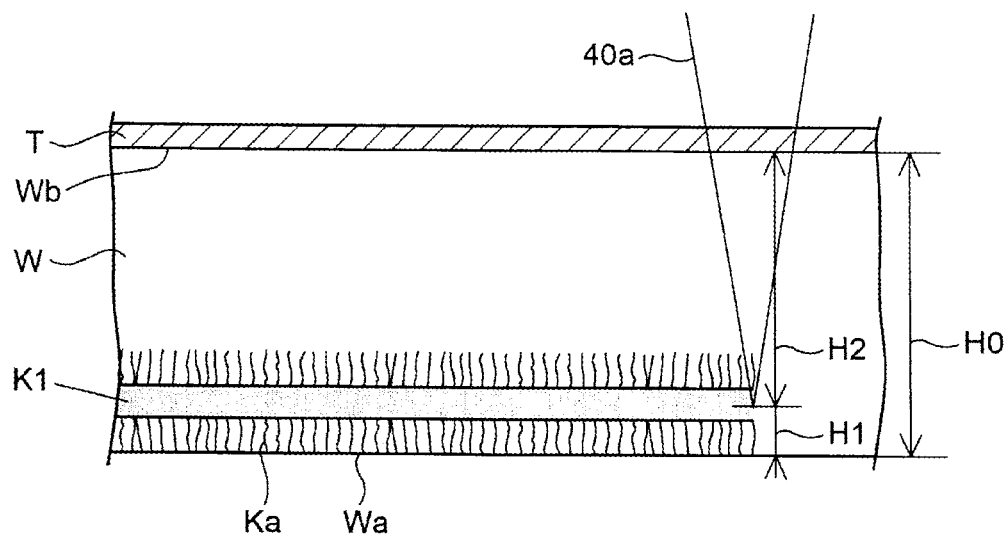
FIG. 10A is a cross-sectional view illustrating a warpage eliminating step by way of example.

As illustrated in FIG. 10A, the warpage eliminating step is a step of, after the holding step, applying the processing laser beam 40*a* whose wavelength is transmittable through the workpiece W to the workpiece W while positioning the focused spot of the processing laser beam 40*a* in the workpiece W at a predetermined first position thicknesswise across the workpiece W, thereby forming modified layers K1 in the workpiece W and cracks Ka extending from the modified layers K1 to the lower surface, i.e., the face side Wa, of the workpiece W, along all of the projected dicing lines S, thereby eliminating the warpage from the workpiece W.

In the example illustrated in FIG. 10A, the predetermined first position thicknesswise across the workpiece W is set to a position that is spaced a distance H1 from the lower surface, i.e., the face side Wa, of the workpiece W, or a position that is spaced a distance H2 from the upper surface, i.e., the reverse side Wb, of the workpiece W. A distance H0 that represents the sum of the distance H1 and the distance H2 corresponds to the thickness of the workpiece W.

Since the cracks Ka reach the lower surface, i.e., the face side Wa, of the workpiece W, the internal stresses that have been present in the workpiece W near the lower surface thereof are released, allowing the lower surface of the workpiece W to spread, thereby eliminating the warpage from the workpiece W. The cracks Ka are developed in the workpiece W along all of the projected dicing lines S.

In the warpage eliminating step, immediately before the processing laser beam 45*b* is applied to the workpiece W along each of the projected dicing lines S, the vertical position of the upper surface, i.e., the reverse side Wb, of the workpiece W is detected, and the focused spot of the processing laser beam 45*b* is positioned on the basis of the detected vertical position of the upper surface, i.e., the reverse side Wb, of the workpiece W.

Specifically, prior to forming the modified layers K1, the measuring heads 51 and 52 apply the respective measuring laser beams 51*a* and 52*a*, as illustrated in FIGS. 5A and 5B, to measure the vertical position of the upper surface, i.e., the reverse side Wb, of the workpiece W that immediately precedes the processing head 40. The measured vertical position of the upper surface, i.e., the reverse side Wb, of the workpiece W is fed back to the controller, whereupon the controller corrects the focused spot of the processing laser beam 45*b*.

Even if the workpiece W is warped to a large extent, therefore, the focused spot of the processing laser beam can be positioned at a predetermined position thicknesswise across the workpiece W, causing the cracks Ka to reliably reach the lower surface, i.e., the face side Wa, of the workpiece W for eliminating the warpage from the workpiece W.

The vertical position of the upper surface, i.e., the reverse side Wb, of the workpiece W may vary due to the elimination of the warpage from the workpiece W on account of the modified layers K1 formed in the workpiece W. However, as the vertical position of the upper surface, i.e., the reverse side Wb, of the workpiece W is detected immediately before the workpiece W is processed, the focused spot of the processing laser beam can be positioned at a predetermined position thicknesswise across the workpiece W.

The modified layers K1 are formed in the workpiece W along all of the projected dicing lines S as follows. As illustrated in FIG. 5A, the workpiece W is processing-fed in the first direction X1, and the processing laser beam 40*a* is applied to the workpiece W to form a modified layer K1 in the workpiece W along a certain projected dicing line S. Thereafter, the workpiece W is indexing-fed a predetermined distance in one of the Y-axis directions. Then, as illustrated in FIG. 5B, the workpiece W is processing-fed in the second direction X2, and the processing laser beam 40*a* is applied to the workpiece W to form a modified layer K1 in the workpiece W along a next projected dicing line S. After the modified layers K1 have been formed in the workpiece W along all of the projected dicing lines S that extend in the X-axis directions, the workpiece W is turned 90 degrees about its central axis, and then the modified layers K1 are formed in the workpiece W in the same manner as described above along all of the projected dicing lines S that extend perpendicularly to the projected dicing lines S along which the modified layers K1 have already been formed in the workpiece W.

<Modified Layer Forming Step>

Figure 10B:
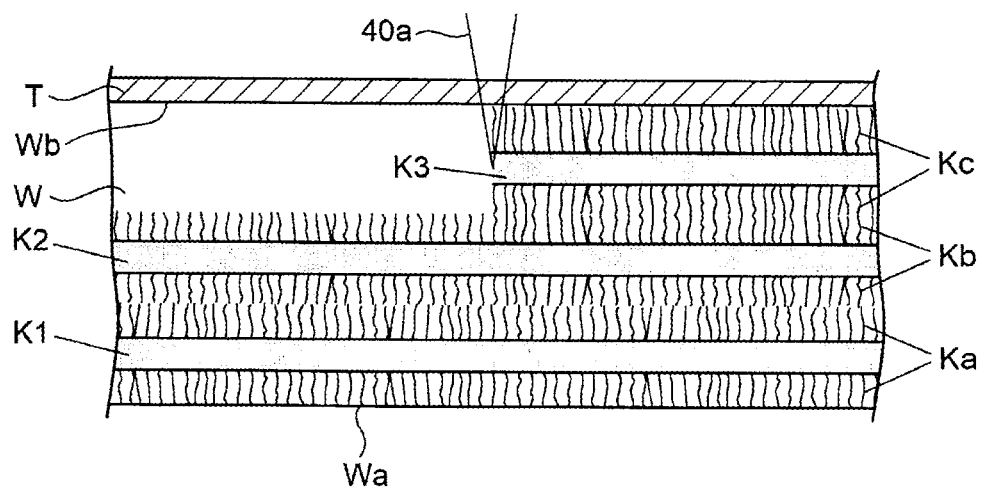
FIG. 10B is a cross-sectional view illustrating a modified layer forming step by way of example.

As illustrated in FIG. 10B, the modified layer forming step is a step of, after the warpage eliminating step, applying the processing laser beam 40*a* to the workpiece W along a projected dicing line while positioning the focused spot of the processing laser beam 40*a* in the workpiece W at positions above the first position away from the lower surface, i.e., the face side Wa, of the workpiece W, forming modified layers K2 and K3 in the workpiece W along the projected dicing line.

In the example illustrated in FIG. 10B, the processing laser beam 40*a* is applied to the workpiece W along each of the projected dicing lines while the focused spot of the processing laser beam 40*a* is positioned in the workpiece W at a second position above the first position, thereby forming a second modified layer K2 in the workpiece W. Thereafter, the processing laser beam 40*a* is applied to the workpiece W along the projected dicing line while the focused spot of the processing laser beam 40*a* is positioned in the workpiece W at a third position above the second position, thereby forming a third modified layer K3 in the workpiece W. Cracks Ka, Kb, and Kc are developed respectively from the modified layers K1, K2, and K3 so as to extend from the face side Wa to the reverse side Wb of the workpiece W. As illustrated in FIG. 10B, the modified layers K1, K2, and K3 are formed in the workpiece W such that the cracks Ka, Kb, and Kc developed from the modified layers K1, K2, and K3 have their tip ends joined together or positioned close enough to be joined together. Alternatively, the modified layers K1, K2, and K3 may be formed in the workpiece W such that the cracks Ka, Kb, and Kc developed from the modified layers K1, K2, and K3 have their tip ends spaced from each other with gaps present therebetween.

The additional two modified layers K2 and K3 may be successively formed in the workpiece W along each projected dicing line S. Alternatively, after modified layers K2 have been formed in the workpiece W along all of the projected dicing lines S, modified layers K3 may be formed in the workpiece W along all of the projected dicing lines S. The structure of the laser processing apparatus 10 illustrated in FIGS. 4, 5A, and 5B allows a modified layer K2 to be formed in the workpiece W while the holding table 13 is moving in a forward stroke along the first direction X1, and also allows a modified layer K3 to be formed in the workpiece W while the holding table 13 is moving in a rearward stroke along the second direction X2.

Further alternatively, the processing laser beam may be branched into a plurality of laser beams, and the focused spots of the laser beams may be positioned at respective positions in the workpiece W that are spaced apart from each other along the laser beams, for forming a plurality of modified layers in the workpiece W along a projected dicing line when the workpiece W is processing-fed in one stroke. Moreover, there is no limitation on the number of modified layers to be formed in the workpiece W along a projected dicing line S.

In the modified layer forming step described above, inasmuch as the warpage has been eliminated from the workpiece W in the warpage eliminating step, unexpected cracks are prevented from being developed in the workpiece W, and projected dicing lines S on the wafer are prevented from being curved or bent during the modified layer forming step. Accordingly, the devices on the workpiece W are prevented from being damaged, and the device chips produced from the workpiece W are prevented from becoming defective in size.

<Dividing Step>

As illustrated in FIGS. 11A and 11B, the dividing step is a step of, after the modified layer forming step, dividing the workpiece W along the projected dicing lines S by exerting external forces to the workpiece W.

FIGS. 11A and 11B illustrate a dividing apparatus 80 for dividing the workpiece W in cross section. As illustrated in FIGS. 11A and 11B, the dividing apparatus 80 includes a frame holding mechanism 81 for gripping the annular frame F of the frame unit U, an actuating mechanism 84 for lifting and lowering the frame holding mechanism 81, and a tubular expanding drum 83 for abutting against the expandable tape T of the frame unit U from below.

As illustrated in FIG. 11A, when the actuating mechanism 84 lowers the frame holding mechanism 81 while the frame holding mechanism 81 is gripping the annular frame F, the expandable tape T is held on the expanding drum 83 from below and expanded radially outwardly as it is pulled by the frame holding mechanism 81.

When the expandable tape T is expanded radially outwardly, it exerts radially outward external forces on the workpiece W affixed to the expandable tape T, dividing the workpiece W from the modified layers as division initiating points along the projected dicing lines S into device chips C. After the workpiece W has been divided, the expandable tape T is heat-shrunk to keep the device chips C spaced apart.

In addition to expanding the expandable tape T radially outwardly to divide the workpiece W, the reverse side Wb of the workpiece W with the modified layers formed therein may be ground to divide the workpiece W.

Further alternatively, the number of modified layers formed in the workpiece W may be increased to develop a multiplicity of cracks in the workpiece W, thereby dividing the workpiece W, after which the expandable tape T may be radially outwardly expanded to widen the clearances between the device chips, followed by heat-shrinking the expandable tape T to keep the device chips spaced apart.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a warped workpiece with a plurality of intersecting projected dicing lines established thereon, comprising:
   a placing step of placing the workpiece in an upwardly convex orientation on a holding surface of a holding table that is capable of holding the workpiece under suction thereon;
   a warpage eliminating step of, after the placing step, holding the workpiece under suction on the holding surface of the holding table and applying a laser beam whose wavelength is transmittable through the workpiece to the workpiece while positioning a focused spot of the laser beam in the workpiece at a predetermined first position thicknesswise across the workpiece, thereby forming modified layers in the workpiece and cracks extending from the modified layers to a lower surface of the workpiece along all of the projected dicing lines, thereby eliminating the warpage from the workpiece; and
   a modified layer forming step of, after the warpage eliminating step, applying the laser beam to the workpiece while positioning the focused spot of the laser beam in the workpiece at a position above the first position away from the lower surface of the workpiece, thereby forming modified layers in the workpiece along the projected dicing lines, wherein
   the warpage eliminating step includes the steps of detecting the vertical position of an upper surface of the workpiece each time the laser beam is to be applied to the workpiece along each of the projected dicing lines, and positioning the focused spot of the laser beam in the workpiece on a basis of the detected vertical position of the upper surface of the workpiece.

2. The method of processing a warped workpiece according to claim 1, further comprising:
   a dividing step of, after the modified layer forming step, dividing the workpiece along the projected dicing lines by exerting external forces to the workpiece.

3. The method of processing a warped workpiece according to claim 1, wherein the modified layer forming step includes the steps of applying the laser beam to the workpiece along each of the projected dicing lines while positioning the focused spot of the laser beam in the workpiece at a second position above the first position, thereby forming a second modified layer in the workpiece, and thereafter applying the laser beam to the workpiece along the projected dicing line while positioning the focused spot of the processing laser beam in the workpiece at a third position above the second position, thereby forming a third modified layer in the workpiece.

4. The method of processing a warped workpiece according to claim 1, wherein
   the workpiece is warped such that the upper surface thereof is of a convex shape, the placing step includes the step of placing the workpiece on the holding table while the lower surface of the workpiece is facing downwardly toward the holding surface of the holding table, a holding step includes the step of holding the lower surface of the workpiece on the holding table, and each of the warpage eliminating step and the modified layer forming step includes the step of applying the laser beam to the workpiece from the upper surface thereof.

\* \* \* \* \*